United States Patent [19]

Mahulikar

[11] Patent Number: 5,559,306
[45] Date of Patent: Sep. 24, 1996

[54] ELECTRONIC PACKAGE WITH IMPROVED ELECTRICAL PERFORMANCE

[75] Inventor: Deepak Mahulikar, Madison, Conn.

[73] Assignee: Olin Corporation, New Haven, Conn.

[21] Appl. No.: 540,835

[22] Filed: Oct. 11, 1995

Related U.S. Application Data

[63] Continuation of Ser. No. 245,195, May 17, 1994, abandoned.

[51] Int. Cl.⁶ .................................................. H01L 23/02
[52] U.S. Cl. ........................... 174/52.4; 174/35 GC; 257/659
[58] Field of Search .......................... 174/52.1–52.4, 174/35 R, 35 GC; 257/666, 678, 687, 698, 701, 704, 787, 659; 264/272.11, 272.17; 361/816, 818

[56] References Cited

U.S. PATENT DOCUMENTS

| | | | |
|---|---|---|---|
| 3,614,546 | 10/1971 | Avins | 29/577 X |
| 4,105,861 | 8/1978 | Hascoe | 174/52.4 |
| 4,146,695 | 3/1979 | Asai | 174/35 MS |
| 4,320,438 | 3/1982 | Ibrahim et al. | 174/52.4 X |
| 4,480,262 | 10/1984 | Butt | 257/675 |
| 4,570,337 | 2/1986 | Butt | 29/840 |
| 4,577,056 | 3/1986 | Butt | 174/52.4 |
| 4,656,499 | 4/1987 | Butt | 257/677 |
| 4,680,617 | 7/1987 | Ross | 257/795 |
| 4,697,203 | 9/1987 | Sakai et al. | 257/681 |
| 4,717,948 | 1/1988 | Sakai et al. | 257/786 |
| 4,769,344 | 9/1988 | Sakai et al. | 437/216 |
| 4,769,345 | 9/1988 | Butt et al. | 437/217 |
| 4,796,083 | 1/1989 | Cherukuri et al. | 257/699 |
| 4,827,376 | 5/1989 | Voss | 361/708 |
| 4,829,403 | 5/1989 | Harding | 361/386 |
| 4,849,857 | 7/1989 | Butt et al. | 361/708 |
| 4,882,212 | 11/1989 | Singhdeo et al. | 428/76 |
| 4,939,316 | 7/1990 | Mahulikar et al. | 174/52.4 |
| 4,953,002 | 8/1990 | Nelson et al. | 257/659 |
| 4,961,106 | 10/1990 | Butt et al. | 257/710 |
| 5,024,883 | 6/1991 | Singhdeo et al. | 428/323 |
| 5,043,533 | 8/1991 | Spielberger | 174/52.4 |
| 5,043,534 | 8/1991 | Mahulikar et al. | 174/52.4 |
| 5,043,535 | 8/1991 | Lin | 174/52.4 |
| 5,108,553 | 4/1992 | Foster et al. | 205/125 |
| 5,122,858 | 6/1992 | Mahulikar et al. | 257/753 |
| 5,223,739 | 6/1993 | Katsumata et al. | 257/676 |
| 5,279,029 | 1/1994 | Buins | 29/856 |
| 5,289,039 | 2/1994 | Ishida et al. | 257/796 |

Primary Examiner—Laura Thomas
Assistant Examiner—Christopher Horgan
Attorney, Agent, or Firm—Gregory S. Rosenblatt; Robert S. Hauser

[57] ABSTRACT

An electronic package having improved electrical properties in which a plastic Quad Flat Pack is provided with upper and lower metallic plates encased in the plastic body and overlapping at least a portion of the length of the encased portion of the leads whereby the self and mutual inductance of the package is reduced. A ceramic Quad Flat Pack is provided with metal plates attached to the mating surfaces of the ceramic cover component and the ceramic base component so that at least a portion of the enclosed portion of the leads which are electrically connected to the electronic component inside the components is overlapped on the top and bottom by the metallic plates.

8 Claims, 2 Drawing Sheets

ELECTRONIC PACKAGE WITH IMPROVED ELECTRICAL PERFORMANCE

This application is a continuation of application Ser. No. 08/245,195, filed May 17, 1994 which is incorporated herein by reference in its entirety, now abandoned.

BACKGROUND OF THE INVENTION

1. Field of the Invention

This invention relates generally to electronic packages. More particularly, this invention relates to electronic packages for containing an electronic component and having improved electrical properties.

2. Background

In the electronics industry, the rapid development and extensive use of integrated circuits, such as silicon based semiconductor devices, have resulted in the proliferation of package designs to house the electronic devices. Among such designs are the type of packages known as Plastic Quad Flat Packs (PQFPs), Metal Quad Flat Packs (Metal QFPs) and Ceramic Quad Flat Packs (Ceramic QFPs). Each of these package formats, with its unique design features, has certain advantages in the areas of cost, reliability and performance.

One desirable property of such electronic packages is low self and mutual inductance. This is particularly important at high speeds as reduced self inductance and mutual induction provides improved performance due to reductions in switching noise, crosstalk and propagation delays. It has been found that among the three types of electronic packages mentioned above, the metal QFPs have the best performance as far as self and mutual induction is concerned. One such metal QFP has an anodized aluminum base and anodized aluminum cover adhesively joined together. This type of package is more fully disclosed in Mahulikar et al. U.S. Pat. No. 4,939,316 which is incorporated by reference herein in its entirety.

Tests of the electrical properties of various 160 lead QFP packages at 1 MHz frequency have shown that the self inductance for metal QFPs of the type described in U.S. Pat. No. 4,939,316 is 7 nanohenrys as compared to 9.8 nanohenrys for the plastic QFPs and 30 nanohenrys for the ceramic QFPs. Thus, it is desirable that the inductance properties of the PQPF and the ceramic QPF be improved to at least that of the metal QPF.

Metal foil layers have been incorporated into electronic packages having plastic components, primarily as a contamination barrier. Such packages are disclosed in Butt U.S. Pat. No. 4,480,262 and Sakai et al. U.S. Pat. No. 4,717,948. However, there remains a need to fashion metallic plates which can be incorporated into plastic or ceramic electronic packages that have a configuration effective to reduce inductance and cross talk.

SUMMARY OF THE INVENTION

In view of the above, it is an object of the present invention to provide an electronic package of the type know as a plastic Quad Flat Pack which has improved electrical characteristics.

More specifically, it is an object of the present invention to provide a plastic Quad Flat Pack having improved self and mutual inductance properties.

Another object of the present invention is to provide an electronic package of the type known as a ceramic Quad Flat Pack which has improved electrical properties.

Still more specifically, it is an object of the present invention to provide a ceramic Quad Flat Pack having improved self and mutual inductance properties.

These and other objects and advantages of the present invention may be achieved according to one embodiment of the present invention through the provision of an electronic package which comprises an electronic device, electrical leads electrically connected to said electronic device, a plastic body encasing said electronic device and a portion of said leads, and metallic plates overlapping at least a portion of the encased portion of the leads, one of said metal plates being positioned above said leads and another of said metal plates positioned below said leads. The plates extend in a plane generally parallel to the electrical leads.

According to another embodiment of the present invention an electronic package comprises a ceramic cover component, a ceramic base component, an electronic device housed between said cover component and said base component, a leadframe including leads electrically connected to said electronic device and extending from the interior of the package between mating faces on said cover component and said base component to the outside of components, an upper metallic plate positioned on the mating surface of said cover component, a lower metallic plate positioned on the mating surface of the base component so that the leads extend between the upper and lower plates, and sealing means sealing the leads between the upper and lower plates.

BRIEF DESCRIPTION OF THE DRAWINGS

The objects and advantages of the present invention will become more apparent by reference to the following detailed description and to the accompanying drawings in which.

DETAILED DESCRIPTION

Figure 1:
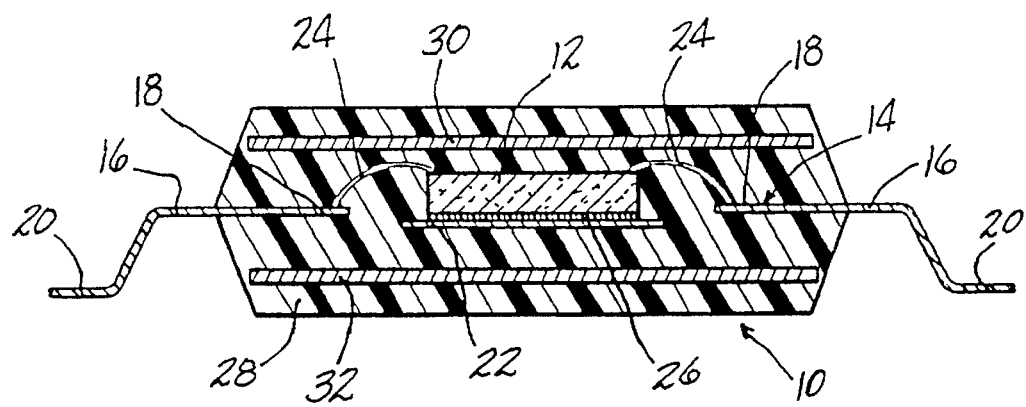
FIG. 1 is a cross-sectional representation of one type of an electronic package incorporating the principles of the present invention.

Referring to the drawings, and particularly FIG. 1, there is shown a typical plastic Quad Flat Pack 10 incorporating the present invention. Such a package 10 is adapted to contain an electronic component 12 which may typically be a silicon based semiconductor device. A leadframe 14 is provided which is generally formed from an electrically conductive material such as copper, copper alloy or an iron-nickel alloy. In a known manner, the leadframe 14 includes a plurality of leads 16, each having an inner end 18 and outer end 20. The inner ends 18 of each of the leads 16 are disposed about a centrally disposed chip or die pad 22.

Wire bonds 24 electrically interconnect input/output pads (not shown) located on the electrically active face of the electronic component 12 to the inner ends of leads 16. A tie bar (not shown) supports the outer ends 20 of the leads 16 and also the pad supports (not shown) which are connected to the die pad 22 in a known manner. Following package assembly, the tie bar is severed to electrically isolate the leads 16. A suitable adhesive or die attach 26 bonds the semiconductor device 12 to the die pad 22.

As shown in FIG. 1, a solid plastic body 28 encases the electronic device 12, die pad 22, and a portion of the leads 16. The body 28 may be formed by injecting any one of the various well known plastic compounds into a mold around the electric device 12, die pad 22 and the portion of the leads 16 to be encased. The outer lead ends 20, which project from the plastic body 28, are adapted to be connected to an external device such as a printed circuit board.

In accordance with the present invention, the standard plastic electronic package as described above is provided with a first metallic plate member 30 contained within the molded plastic body 28 and a second metallic plate member 32, also contained within the plastic body 28. As will be seen in FIG. 1, both the first and second plate members 30 and 32 are flat and extend generally horizontally, in a plane generally parallel to a plane containing the inner ends 18 of the leads 16, and overlap a substantial portion of the encased portion of the leads 16.

To achieve the maximum reduction in the self and mutual inductance, the plate members 30 and 32 should be positioned as close to the leads 16 as possible. The average distance between the plate members 30,32 and the inner leads is less than about 0.51 millimeter (0.02 inch) and preferably from about 0.013 mm to about 0.38 mm (0.0005–0.015 inch).

The metal plates 30 and 32 should also overlap the encased portion of the leads for as great a length of the encased portion as possible. At least about 66% of the length of the encased portion of the leads 16 should be covered to obtain the desired reduction in inductance. The plate members 30 and 32 may generally be fabricated from any metal, with copper, copper alloy, aluminum and anodized aluminum being the preferred materials.

Metal plates of any thickness are effective for reducing inductance through what is believed to be interaction of the signal current in a lead 16 and an image current in the metal plates 30 and 32. For handling purposes during the molding operation, the plate members 30 and 32 should be at least 0.13 mm (0.005 inch) thick, and preferably between about 0.25 mm and about 0.76 mm (0.01–0.03 inch) thick.

Figure 2:
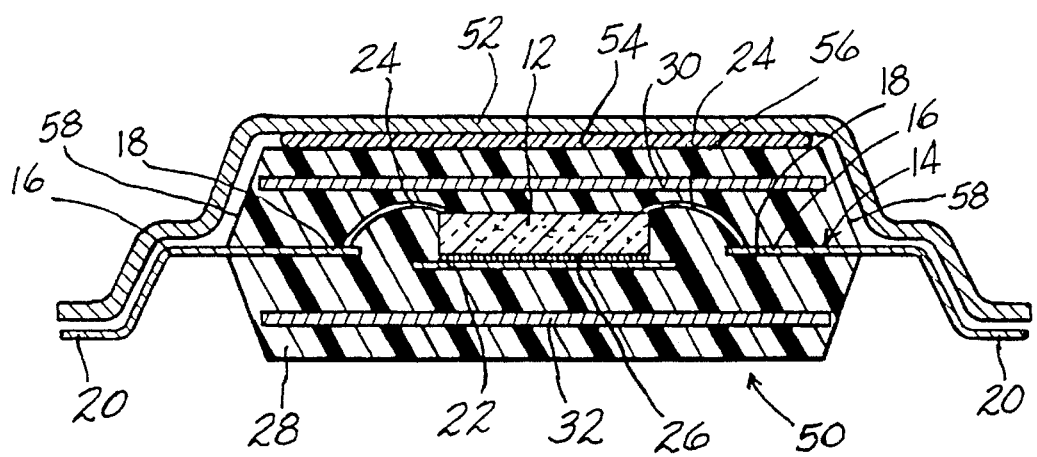
FIG. 2 is a cross-sectional representation of the same type of electronic package as shown in FIG. 1, but provided with a further modification in accordance with the principles of the present invention.

FIG. 2 shows the electronic package of FIG. 1 provided with a further refinement. As shown in this Figure, the electronic package 50 includes the electronic component 12 attached to the die pad 22 of the leadframe 14 by the die attach 26. As in the case of the package of FIG. 1, the leadframe 14 also includes a plurality of leads 16, the inner ends 18 of which are electrically connected to the electronic component 12 by wire bonds 24. First and second plate members 30 and 32 are provided. A solid plastic body 28 encases the electronic device 12, the die pad 22, a portion of the leads 16 and the first and second metal plates 30 and 32 respectively as described in connection with the device shown in FIG. 1.

As shown in FIG. 2, the device of FIG. 1 is provided with a metallic cover or lid 52 attached to the top of the plastic body 28 by a suitable adhesive 54. The cover or lid 52 extends across the top 56 of the plastic body 28, along the upper side portions 58 of the plastic body and along the top of the exposed portions of the leads 16. The metallic cover 52 may be formed from any suitable metal, and, as in the case of the metallic plates 30 and 32, may preferably be formed from copper, copper alloy, aluminum or anodized aluminum.

In the package shown in FIG. 2, the cover or lid 52 not only aids in reducing the mutual and self inductance of the device by providing an imaging current which interacts with the signal current in the leads 16, it will also serve as a heat sink to aid in the dissipation of heat.

Figure 3:
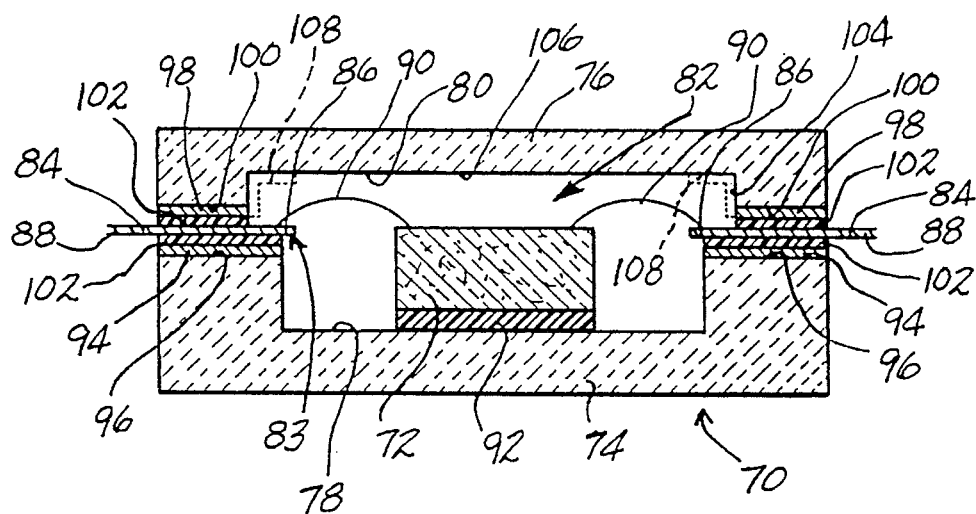
FIG. 3 is a cross-sectional representation of a second type of electronic package incorporating the principles of the present invention.

FIG. 3 shows a ceramic Quad Flat Pack type electronic package 70 adapted to house an electronic component 72 and incorporating the principles of the present invention. The package 70 may include a base component 74 and a cover component 76. A depression 78 is optionally formed in the base component 74. A second depression 80 is optionally formed in the cover component 76. The depressions serve to form a cavity 82 to encase the electronic device 72. The base component 74 and cover component 76 are manufactured from an appropriate ceramic material such as aluminum oxide as is well known in the art.

A leadframe 83 is disposed between the base component 74 and cover component 76. The leadframe 83 comprises leads 84, each having an inner lead end 86 and an outer lead ends 88. The inner lead ends 86 are electrically connected to the electronic component 72 by wire bonds 90. The outer lead ends 88 are adapted for connection to an external device such as a printed circuit board. The electronic device 72 is bonded to the inside of the base component 74 by a die attach 92.

In accordance with the present invention, a second metal plate 94 is provided on the face 96 of the base component 74 which mates with the cover component 76. Similarly, a first metal plate 98 is provided on the corresponding mating face 100 of the cover component 76 so that the leads 84 pass between the two plates 94 and 98. The second and first plates 94 and 98 are secured to the faces 96 and 100 of their respective base component 74 and cover component 76 by either a suitable adhesive or they are created by a suitable metallization technique such as thick film deposition. Bonding layers 102 seal the lead frame 82 to the metallic plates 94 and 98 of the base component 74 and cover component 76 respectively as shown. The bonding layers 102 may be any adhesive know in the art and are commonly a polymer adhesive or sealing glass.

The metal plates 94 and 98 should run generally parallel to the plane defined by the inner lead portions and overlap the inner encased portions of the leads 84 to as great an extent as possible to provide for the greatest reduction in the self and mutual inductance.

The mating face 100 of the cover component 76 is generally shorter in length (length being defined as the direction in which the leads 84 extend) than the length of the mating face 96 of the base component 77 due to the necessity for a larger depression 80 in the cover component 76 to provide clearance for the attachment of the wire bonds 90 to the leads 84. Thus, the second plate 94 overlaps the enclosed portion of the leads 84 by an amount approaching 100%. On the other hand, the first metal plate 98, which extends across the mating face 100 of the cover component 76, does not overlap the leads 84 to the same extent as the second plate 94. However, the first metal plate should overlap at least 66% of the length of the enclosed portion of the leads 84. If desired, the first metal plate 98 may be extended inwardly along the side wall 104 and bottom 106 of the depression 80 in the cover component 76 as indicated by the dotted line 108 in FIG. 2 so that a greater proportion of the length of the leads 84 is overlapped by the first plate member 96.

Figure 4:
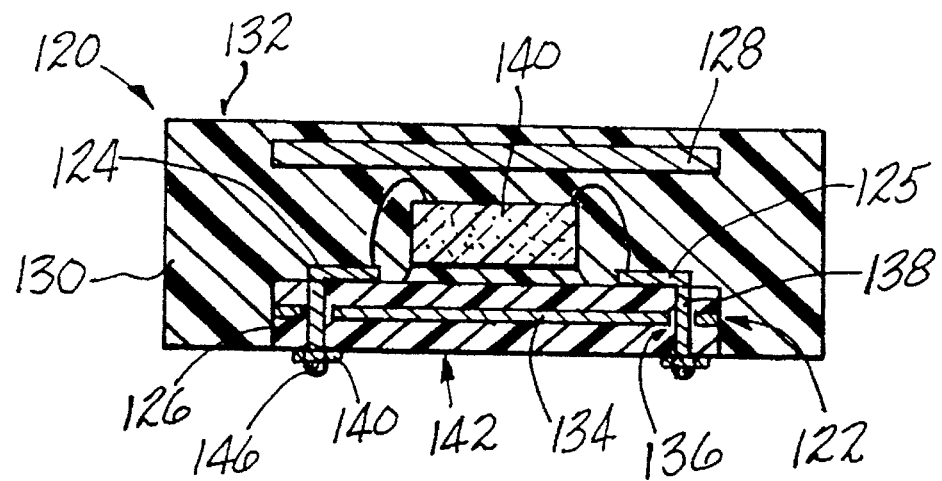
FIG. 4 is a cross-sectional representation of a leadless electronic package incorporating the principles of the invention.

The metallic plates of the invention are also applicable to leadless electronic packages such as pin grid arrays, ball grid arrays and pad grid arrays. FIG. 4 shows in cross sectional-representation a ball grid array package 120. The package 120 has a printed circuit board base 122 with one or more conductive layers 124 separated by dielectric layers 126. Typically, the conductive layers are formed from copper or copper alloy foil and formed into a desired pattern of circuit traces 125 by selective chemical etching. The dielectric layers are typically ceramic or a polymer such as a glass filled epoxy or polyimide.

A first metallic plate 128 substantially as described above is either encapsulated within a molding resin 130 or mounted to a top surface 132 of the package 120. In any case, the first metallic plate runs generally parallel to the circuit traces formed in the conductive layers.

A second metallic plate may underlie the printed circuit board base 122, or preferably, be formed from one of the conductive layers as a ground plane 134. Since the dielectric layers are thin, usually on the order of 0.13 mm–0.25 mm (0.005–0.010 inch), the ground plane 134 is in close proximity to the circuit traces 125. The ground plane 134 is selectively etched to include apertures 136 that receive conductive vias 138.

The circuit traces 125 electrically interconnect a semiconductor device 140 to conductive pads 142 formed on a surface 144 of the printed circuit board base 122 by means of the conductive vias 138. Solder balls 146 may be bonded to the conductive pads 142 to facilitate bonding to external circuitry.

Figure 5:
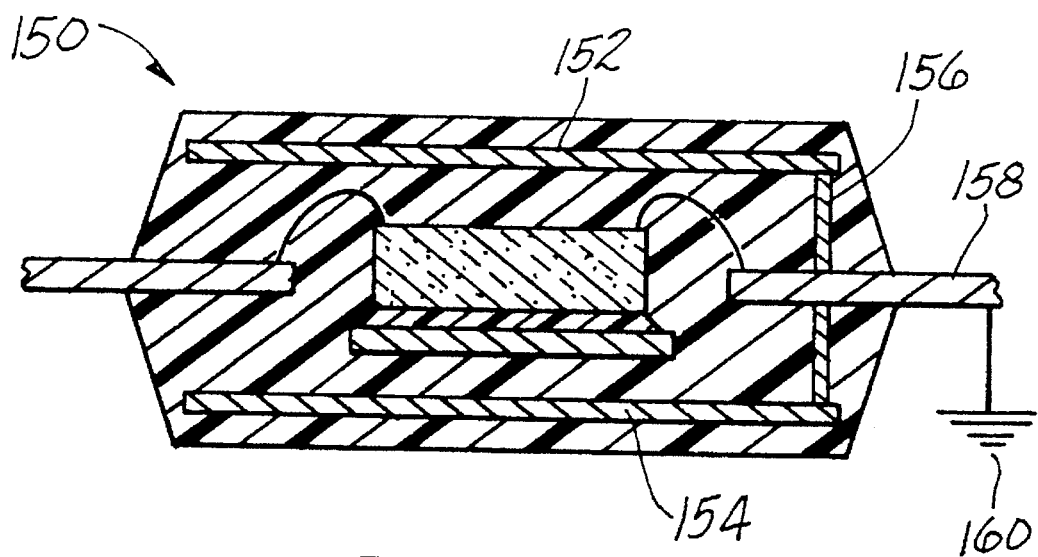
FIG. 5 is a cross-sectional representation of an electronic package having grounded metal plates in accordance with an embodiment of the invention.

FIG. 5 illustrates in cross-sectional representation another embodiment of the invention. In the electronic package 150, the first metallic plate 152 and the second metallic plate 154 are electrically interconnected by a conductive post 156, wire or other means. Having the first and second metallic plates 152, 154 at the same voltage potential improves the reduction in self and mutual inductance generated by the electric signal traveling through the leads and also reduces electromagnetic interference (EMI) inductance caused by electromagnetic waves generated by external circuits as more fully described in Mahulikar et al. U.S. Pat. No. 5,043,534 which is incorporated by reference herein in its entirety.

The electrically interconnected metallic plates 152, 154 may be electrically interconnected to a lead 158 of a leadframe and then to an external ground 160 for improved performance.

While the invention has been described in terms of electronic packages having a single semiconductor device, each embodiment above is applicable to electronic packages having a plurality of semiconductor devices or multiple circuits including multi-chip modules and hybrid circuits.

While the metallic plates of the invention have been generally described as embedded within a molding resin, one or both plates may form an outer surface of the package.

It will thus be realized that with the provision of the metal plates in accordance with the present invention, the self and mutual inductance of a plastic or ceramic Quad Flat Pack will be reduced which will result in improved electrical properties of the electronic package and improved performance.

While the invention has been described above with reference to specific embodiments thereof, it is apparent that many changes, modifications, and variations can be made without departing from the concepts disclosed herein. Accordingly, it is intended to embrace all such changes, modifications, and variations that fall within the scope of the appended claims.

What is claimed is:

1. An electronic package comprising:
   a) a leadframe having a plurality of leads, each of said plurality of leads having an inner lead portion and an outer lead portion, and a die pad;
   b) an electronic device mounted on said die pad and electrically connected to said inner lead portions;
   c) a plastic body encasing said electronic device and said inner lead portions with said outer lead portions projecting beyond said plastic body; and
   d) at least one metallic plate within the plastic body overlapping at least 66% of the length of said encased inner lead portions, said at least one metallic plate extending in a plane generally parallel to said inner lead portions and in contact only with the plastic body.

2. The electronic package of claim 1 wherein said at least one metallic plate has a thickness of at least 0.13 mm (0.005 inch).

3. The electronic package of claim 2, wherein said at least one metallic plate has a thickness of between about 0.25 mm and about 0.76 mm (0.10–0.30 inch).

4. The electronic package of claim 1 further including a metallic cover member extending across the top of said plastic body and a portion of the sides thereof, said metallic cover member also covering at least a portion of the projecting outer lead portions.

5. An electronic package comprising:
   a) an electronic device;
   b) a base supporting said electronic device having one or more conductive layers patterned into circuit traces and separated by dielectric layers;
   c) a plastic body encasing said electronic device and said base; and
   d) an insulated flat metallic plate positioned above said base within said plastic body extending in a plane generally parallel to said one or more conductive layers.

6. An electronic package comprising:
   a) a ceramic cover component;
   b) a ceramic base component;
   c) an electronic device housed between said cover component and said base component;
   d) a leadframe including leads electrically connected to said electronic device and extending from the interior of the package between mating faces on said cover component and said base component to the outside of the package; and
   e) at least one electrically insulated metallic plate overlapping at least 66% of the length of that portion of the leads contained between the cover component and the base component.

7. The electronic package of claim 6 wherein said cover component and said base component have depressions in the interior thereof for housing said electronic component, the mating surfaces being defined by the thickness of the side walls of the components, the mating face of the base component having a greater length in the direction of the length of the leads than the mating face of said cover component.

8. The electronic package of claim 7 wherein the first plate extends inwardly along the wall defining the depression in said cover component.

\* \* \* \* \*